United States Patent
Sudo

(10) Patent No.: US 7,727,834 B2
(45) Date of Patent: Jun. 1, 2010

(54) CONTACT CONFIGURATION AND METHOD IN DUAL-STRESS LINER SEMICONDUCTOR DEVICE

(75) Inventor: Gaku Sudo, Yokohama (JP)

(73) Assignee: Toshiba America Electronic Components, Inc., Irvine, CA (US)

( * ) Notice: Subject to any disclaimer, the term of this patent is extended or adjusted under 35 U.S.C. 154(b) by 136 days.

(21) Appl. No.: 12/031,272

(22) Filed: Feb. 14, 2008

(65) Prior Publication Data

US 2009/0206414 A1    Aug. 20, 2009

(51) Int. Cl.
    *H01L 21/00* (2006.01)
(52) U.S. Cl. .................. 438/228; 438/199; 438/233
(58) Field of Classification Search .......... 438/228, 438/199, 233
    See application file for complete search history.

(56) References Cited

U.S. PATENT DOCUMENTS

| | | | |
|---|---|---|---|
| 7,238,990 B2 * | 7/2007 | Burnett et al. ............. | 257/351 |
| 7,288,451 B2 * | 10/2007 | Zhu et al. .................. | 438/228 |
| 7,442,598 B2 * | 10/2008 | Grudowski et al. ......... | 438/199 |
| 7,466,008 B2 * | 12/2008 | Ko et al. .................... | 257/526 |
| 7,471,548 B2 * | 12/2008 | Baiocco et al. ............. | 365/156 |
| 7,504,289 B2 * | 3/2009 | Lim et al. ................... | 438/154 |
| 7,569,888 B2 * | 8/2009 | Sudo .......................... | 257/369 |
| 7,585,720 B2 * | 9/2009 | Sudo .......................... | 438/199 |
| 7,592,653 B2 * | 9/2009 | Sudo .......................... | 257/285 |
| 2007/0246741 A1 * | 10/2007 | Sudo .......................... | 257/178 |
| 2007/0252230 A1 * | 11/2007 | Zhu et al. ................... | 257/499 |
| 2008/0050869 A1 * | 2/2008 | Sudo .......................... | 438/228 |
| 2008/0179638 A1 * | 7/2008 | Dyer et al. .................. | 257/288 |
| 2008/0179661 A1 * | 7/2008 | Richter et al. .............. | 257/327 |
| 2009/0014807 A1 * | 1/2009 | Tang et al. .................. | 257/369 |
| 2009/0014808 A1 * | 1/2009 | Lee et al. ................... | 257/369 |
| 2009/0017630 A1 * | 1/2009 | Lee et al. ................... | 438/702 |
| 2009/0057809 A1 * | 3/2009 | Richter et al. .............. | 257/499 |
| 2009/0061645 A1 * | 3/2009 | Richter et al. .............. | 438/763 |
| 2009/0072312 A1 * | 3/2009 | Chang et al. ............... | 257/351 |
| 2009/0101943 A1 * | 4/2009 | Miyashita ................... | 257/288 |
| 2009/0101987 A1 * | 4/2009 | Hiyama et al. .............. | 257/369 |
| 2009/0108367 A1 * | 4/2009 | Yokoyama .................. | 257/369 |
| 2009/0140396 A1 * | 6/2009 | Richter et al. .............. | 257/635 |
| 2009/0166814 A1 * | 7/2009 | Hohage et al. .............. | 257/640 |
| 2009/0200615 A1 * | 8/2009 | Kanegae et al. ............ | 257/369 |
| 2009/0206414 A1 * | 8/2009 | Sudo .......................... | 257/369 |
| 2009/0243049 A1 * | 10/2009 | Frohberg et al. ........... | 257/635 |
| 2009/0275200 A1 * | 11/2009 | Richter et al. .............. | 438/694 |

OTHER PUBLICATIONS

Yang, et al., "Dual Stress Liner for High Performance sub 45-nnm Gate Length SOI CMOS Manufacturing", IEEE 2004, 28.8.1-28.8.3.

* cited by examiner

Primary Examiner—Laura M Menz
(74) Attorney, Agent, or Firm—Banner & Witcoff, Ltd.

(57) ABSTRACT

A method for manufacturing a semiconductor device may comprise forming a conductive layer on a substrate, removing at least one portion of the conductive layer to form a plurality of separate conductive lines, forming a first stress-inducing layer of a first stress type on the conductive lines and the substrate, and removing a portion of the first stress-inducing layer such that a remaining portion of the first stress-inducing layer is disposed on a first subset of the conductive lines but not a second subset of the conductive lines and has a boundary disposed between two of the conductive lines. This method, along with other methods and various semiconductor devices, are described.

5 Claims, 6 Drawing Sheets

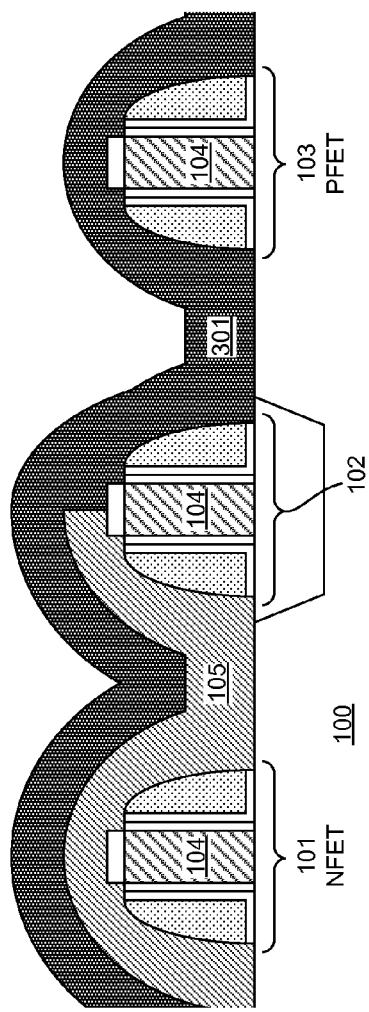
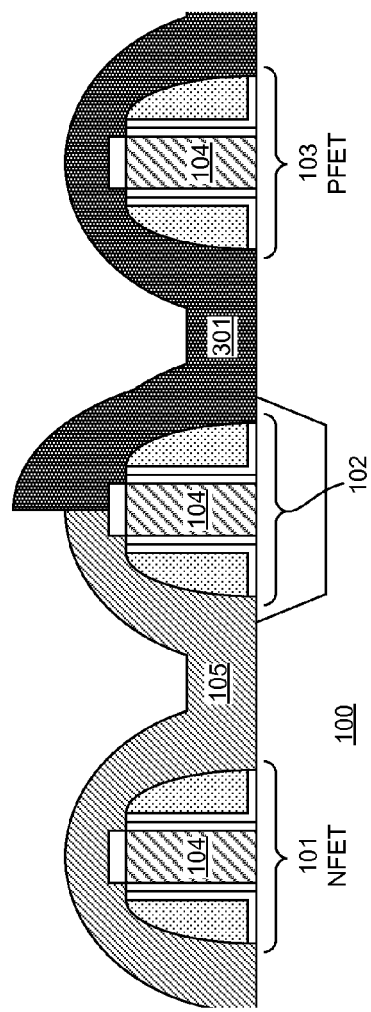
Fig. 3  Prior Art
Fig. 4  Prior Art

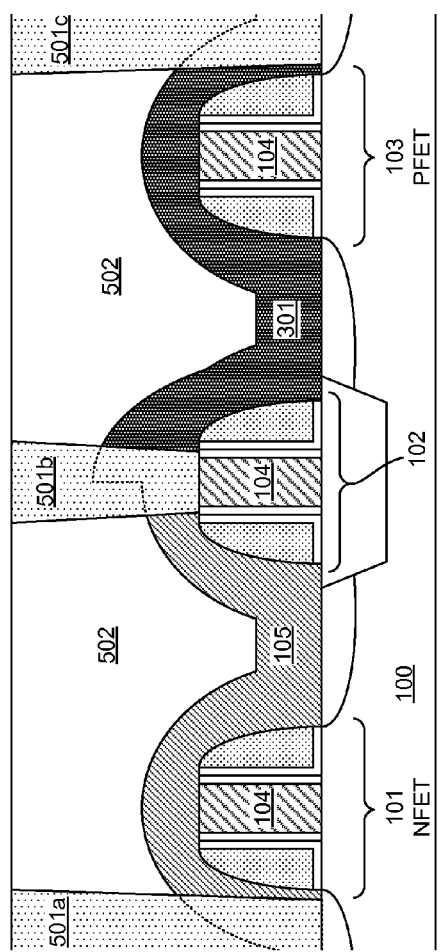
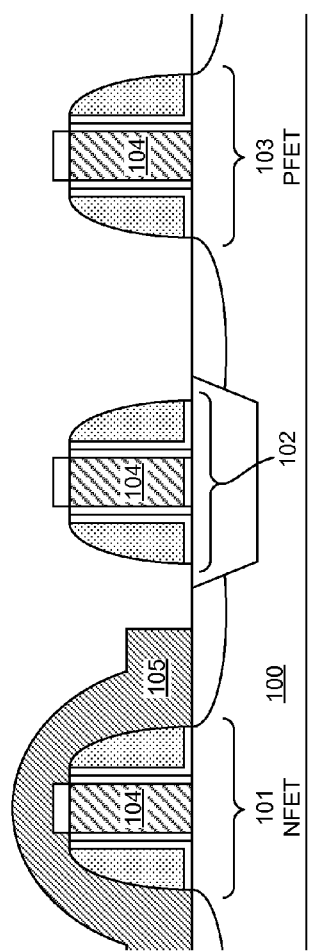
Fig. 5 Prior Art
Fig. 6

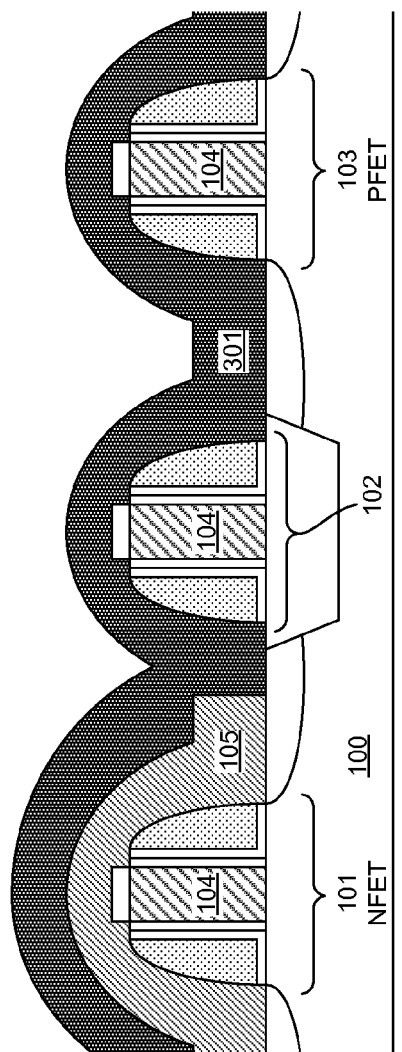
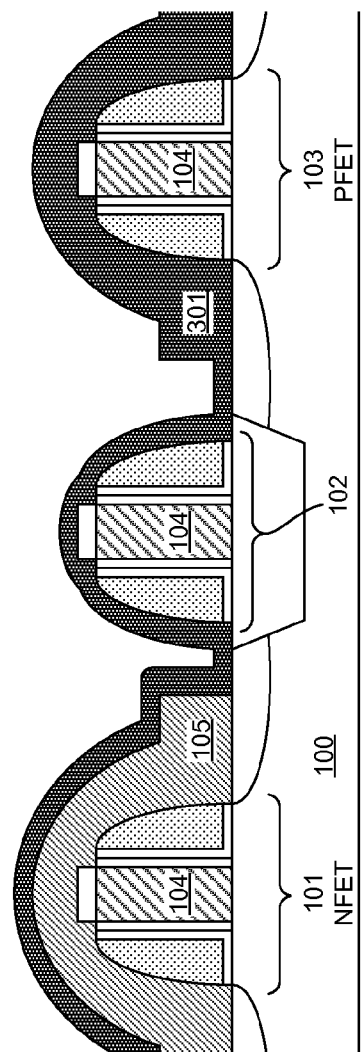

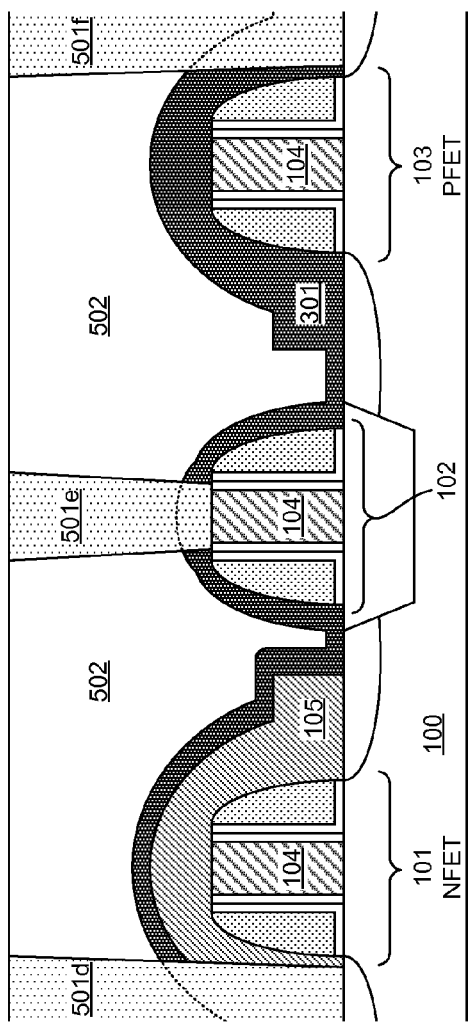
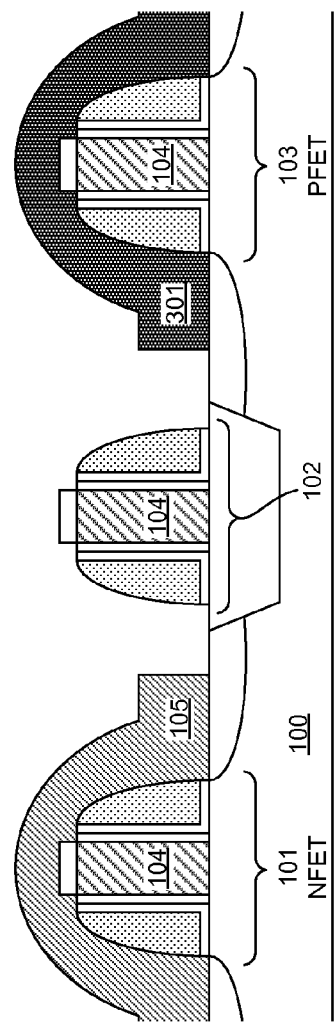
Fig. 9
Fig. 10

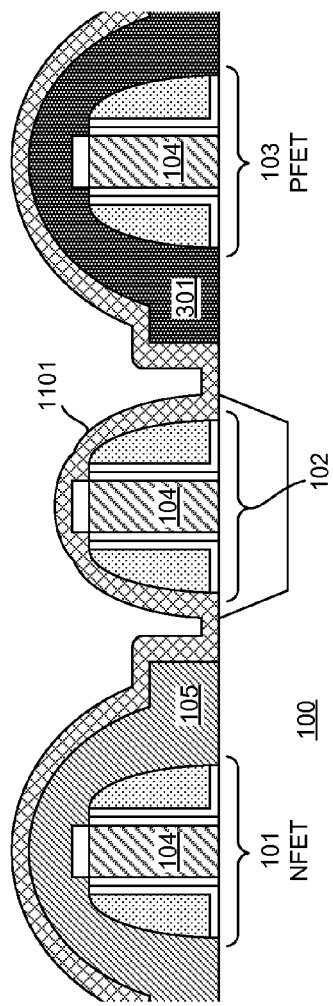
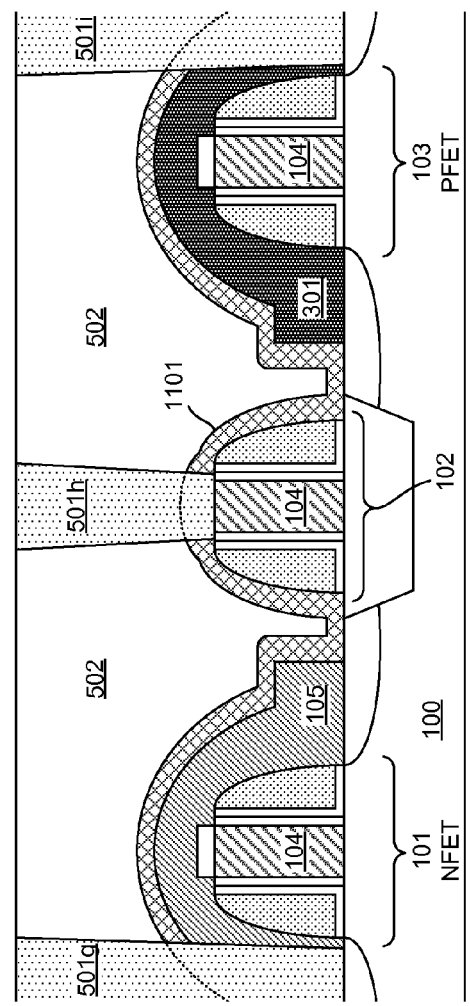

CONTACT CONFIGURATION AND METHOD IN DUAL-STRESS LINER SEMICONDUCTOR DEVICE

BACKGROUND

Many semiconductor devices incorporate a dual-stress liner that blankets the various transistors of the devices and enhances their performance. In a dual-stress liner, a compressive stress liner is disposed over a region containing P-type field-effect transistors (PFETs) such that a compressive stress is induced on the PFET channels, and a tensile stress liner is disposed over a region containing N-type field-effect transistors (NFETs) such that a tensile stress is induced on the NFET channels. Thus, at least one boundary exists between the compressive and tensile stress liners.

There are various issues that should be dealt with when incorporating a dual-stress liner. For instance, at the boundary, the compressive and tensile stress liners may either overlap each other or there may be a gap between the two liners. Exact butting together of the two liners is neither a reliably repeatable nor practical structure to manufacture.

If the boundary has a gap between the two liners, then etching during manufacturing of through-holes in the stress liners intended for conductive contacts may also undesirably etch underlying silicide and silicon layers through the gap.

On the other hand, where the boundary is an overlapping boundary, then difficulties arise in simultaneously etching both the double-thickness overlap region and the single-thickness non-overlap regions of the stress layers. To effectively etch holes through the double layer thickness region, over-etching will typically occur in the single layer thickness regions. This over-etching may damage the device and reduce the yield of operational devices in a given batch. Moreover, since the majority of contacts are located in the single-layer thickness regions of the stress liners, the potential for device damage by over-etching in those regions is very high, thus even further negatively impacting the yield.

SUMMARY

This summary is provided to introduce an illustrative selection of concepts in a simplified form that are further described below in the Detailed Description. This summary is not intended to identify key features or essential features of the claimed subject matter, and instead presents various illustrative aspects described herein.

According to some aspects, a method is provided for manufacturing a semiconductor device. For example, the method may comprise forming a conductive layer on a substrate, removing at least one portion of the conductive layer to form a plurality of separate conductive lines, forming a first stress-inducing layer of a first stress type on the conductive lines and the substrate, and removing a portion of the first stress-inducing layer such that a remaining portion of the first stress-inducing layer is disposed on a first subset of the conductive lines but not a second subset of the conductive lines and has a boundary disposed between two of the conductive lines.

According to further aspects, a semiconductor device is provided. For example, the semiconductor device may comprise a substrate, an n-type field-effect transistor (NFET) disposed in and on the substrate, a p-type field-effect transistor (PFET) disposed in and on the substrate, a conductive line disposed on the substrate and disposed between the NFET and the PFET, a tensile stress-inducing layer having a first thickness disposed on the NFET, and a compressive stress-inducing layer having a second thickness disposed on the PFET, wherein only one of the following is disposed on the conductive line: the tensile stress-inducing layer having a third thickness less than the first thickness, or the compressive stress-inducing layer having a fourth thickness less than the second thickness.

According to still further aspects, a semiconductor device may be provided that comprises a substrate, an n-type field-effect transistor (NFET) disposed in and on the substrate, a p-type field-effect transistor (PFET) disposed in and on the substrate, a conductive line disposed on the substrate and disposed between the NFET and the PFET, a tensile stress-inducing silicon nitride layer disposed on the NFET but neither on the PFET nor on the conductive line, a compressive stress-inducing silicon nitride layer disposed on the PFET but neither on the NFET nor on the conductive line, and a neutral stress silicon nitride layer disposed on the NFET, the PFET, and the conductive line.

These and other aspects of the disclosure will be apparent upon consideration of the following detailed description of illustrative embodiments as described below in the Detailed Description.

BRIEF DESCRIPTION OF THE DRAWINGS

A more complete understanding of the present disclosure may be acquired by referring to the following description in consideration of the accompanying drawings, in which like reference numbers indicate like features, and wherein:

FIGS. 1-5 are side cut-away views of an illustrative semiconductor device during various steps of a conventional manufacturing process;

FIGS. 6-9 are side cut-away views of an illustrative semiconductor device during various steps of another manufacturing process; and FIGS. 10-12 are side cut-away views of an illustrative semiconductor device during various steps of still another manufacturing process.

It is noted that the various drawings are not necessarily drawn to scale.

DETAILED DESCRIPTION

The various aspects summarized previously may be embodied in various forms. The following description illustrates various embodiments and other configurations in which the aspects may be practiced. It is understood that the described embodiments are merely examples, that other embodiments may be utilized, and that structural and functional modifications may be made, without departing from the scope of the present disclosure. Except if specifically stated otherwise, where a first layer is described as being "on" or "over" a second layer, such terminology is intended to include structures where the first layer is physically in direct contact with the second layer (such as with no intervening layers), as well as where the first layer is not physically in contact with the second layer and one or more other layers and/or voids are disposed between the first and second layers.

Figure 1:
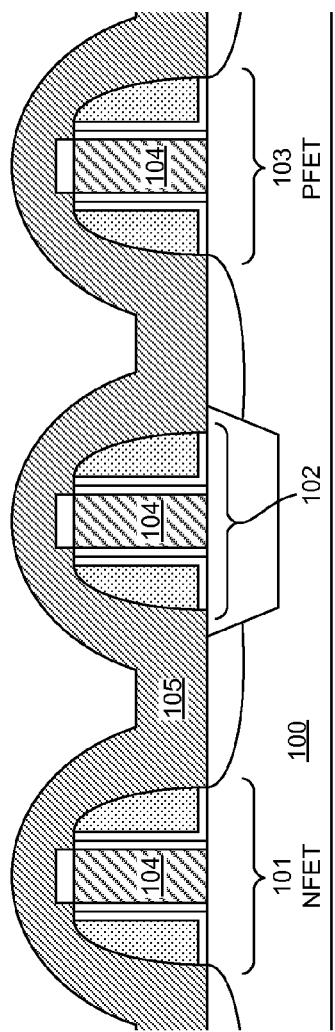

FIGS. 1-5 are side cut-away views of an illustrative semiconductor device during various steps of a conventional manufacturing process. Referring to FIG. 1, the semiconductor device has a substrate 100 in and on which circuit elements are formed. Substrate 100 may be any type of substrate, such as a monocrystalline silicon layer or a set of layers commonly referred to as silicon-on-insulator (SOI). Formed in and on substrate 100 are a plurality of transistors, such as transistors 101 and 103. In this example, transistor 101 is an N-type field-effect transistor (N-type FET, or NFET), and transistor 103 is a P-type FET (P-type FET, or PFET). In addition, a plurality of signal transmission structures are formed. In this example, a signal transmission structure 102 is formed in between transistors 101 and 103. Each of transistors 101 and 103, as well as transmission structure 102, include a conductive layer 104 such as doped polysilicon, metal, and/or any other conductive material(s). In transistors 101 and 103, conductive layer 104 acts as a gate. In transmission structure 102, conductive layer 104 acts as a signal transmission line extending across the surface of substrate 100. The layout of substrate 100, transistors 101 and 103, and transmission structure 102 as shown in FIG. 1, is typical of known semiconductor devices. It will be understood that the FET and transmission structure layout shown in FIG. 1 may be repeated many times throughout the same semiconductor device.

Once the above-described elements have been formed such as by using known manufacturing techniques, a stress-inducing layer is deposited to completely cover elements 101-103 (and any other elements, such as additional transistors and transmission structures, as desired). In this example, a tensile layer 105 is formed, such as an appropriately doped silicon nitride (SiN) layer. This means that, once the semiconductor device is completed and at normal operating temperature, tensile layer 105 will apply tensile stress to layers over which tensile layer 105 is formed. For instance, tensile layer 105 will apply a tensile stress to a channel region of NFET 101 (immediately below the gate 104 of NFET 101). Alternatively, layer 105 may be a compressive layer (i.e., a layer that applies compressive stress to one or more layers over which the compressive layer is formed).

Figure 2:
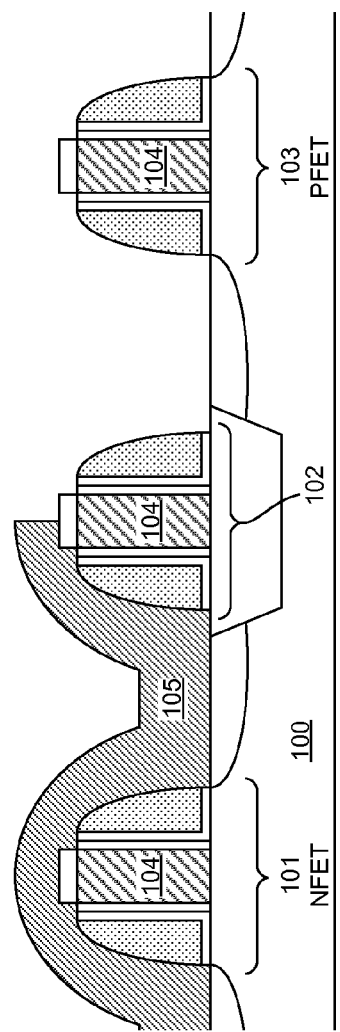

Next, referring to FIG. 2, a portion of tensile layer 105 is removed from regions containing PFETs (such as PFET 103), such as by conventional etching using a mask.

This is because while an NFET may perform better with tensile stress applied to its channel, tensile stress generally has a performance-reducing effect on a PFET. The portion of tensile layer 105 may be removed using well-known techniques, such as by patterning a photo-resist mask (not shown) and subsequently performing reactive-ion etching (RIE) to exposed portions of tensile layer 105. If layer 105 is alternatively a compressive layer, then a portion of layer 105 may instead be removed from regions containing NFETs (such as NFET 101). This is because while a PFET may perform better with compressive stress applied to its channel, compressive stress generally has a performance-reducing effect on an NFET.

Next, referring to FIG. 3, a compressive layer 301 (such as an appropriately doped SiN layer) is deposited on the entire device to cover both exposed PFET 103 and tensile layer 105. The type of stress induced by layer 301 is the opposite of the type of stress induced by layer 105. Thus, where layer 105 is alternatively a compressive stress-inducing layer, then layer 301 would be a tensile stress-inducing layer. In such an alternative case, layer 301 would be deposited on the entire device to cover both exposed NFET 101 as well as layer 105.

Next, referring to FIG. 4, a portion of compressive layer 301 is removed from nearly the entire region where tensile layer 105 resides, except for a relatively small overlapping region 401. Such removal of compressive layer 301 may be performed, for instance, using standard masked etching techniques. This overlap may help prevent or reduce the occurrence of etchants seeping down into lower layers of the device during etching of through-holes, as will be described next.

Referring to FIG. 5, an insulating layer 502, such as an inter-layer dielectric (ILD), is formed over at least some of the exposed surfaces of the device. Then, a plurality of through holes 501 are etched completely through insulating layer 502 and tensile layer 105 and 301. For instance, through hole 501a may be etched down to a source/drain (S/D) region of NFET 101, through hole 501b may be etched down to conductive layer 104b of transmission line structure 102, and through hole 501c may be etched down to an S/D region of PFET 103. Other through holes may also be etched, such as down to gates 104a and 104c of NFET 101 and PFET 103, although these through holes are not shown in this example for ease of viewing the figures. These through holes 501 may be filled with a conductive material, such as metal (for instance, tungsten), and used for providing electrical contacts to the underlying circuit elements. Such conductively-filled through holes are commonly referred to as conductive plugs. For example, for each FET, three conductive plugs may be provided: one for the gate and one for each of the two source/drain regions.

Through holes 501 may be etched, such as by performing RIE. Through holes may be etched simultaneously throughout the entire device if desired. In such a case, because the different through holes 501 are etched through different thicknesses of layers 105 and/or 301, some of the through holes 501 will be over-etched to allow for all through holes 501 to extend completely through layers 105 and 301. The alternative would be to under-etch some of through holes 501, which is undesirable and would likely render the device inoperable. Therefore, all of through holes 501 in this example are etched using etching that is applied at such a strength and for such a length of time that is sufficient to traverse through the thickest portion of layers 105 and 301. For example, in the embodiment of FIG. 5, through hole 501b must traverse through both layers 105 and 301, whereas through holes 501a and 501c need traverse through only a single one of layer 105 or layer 301, respectively. Thus, through holes 501a and 501c are over-etched to compensate for allowing through hole 501b to be sufficiently etched completely through layers 105 and 301.

Each through hole 501 that is over-etched undergoes an increased risk of that through hole 501 etching so far into the underlying layer(s) that the underlying layer(s) are substantially damaged. This damage may render the entire device inoperable, and so it may be desirable to minimize the number of through holes that are over-etched. In other words, the more through holes 501 that are over-etched, the greater the chance that the device will be rendered inoperable, which in turn lowers manufacturing yield and throughput. This risk is greatly reduced in the illustrative device of FIG. 5, in which there are far more through holes that traverse only a single layer 103 or 501 (such as through holes 501a and 501c) than through holes that traverse a double layer 103 and 501 (such as through hole 501b). Thus, in the illustrative device of FIG. 5, a relatively large percentage of through holes located at a single-thickness region are over-etched to allow for a relatively small percentage of through holes located at a double-thickness region to be sufficiently etched.

As will be discussed with regard to the examples of FIGS. 6-12, the manufacturing process may be modified such that an even smaller percentage of through-holes are over-etched. This may allow for even fewer manufactured devices to be rendered inoperable, thereby even further increasing manufacturing yield and throughput.

The illustrative structure shown in FIG. 6 may be built as previously discussed above with regard to FIGS. 1 and 2, except that after depositing tensile layer 105, a different portion of tensile layer 105 may be removed. Such removal may be performed using, for instance, conventional techniques involving forming and patterning a mask layer over the device and then etching the through holes using the mask layer as a mask. In this example, tensile layer 105 is removed such that the remaining portion of tensile layer 105 has a boundary at a location between gate 104 of NFET 101 and transmission line 104.

This differs from FIG. 2, in which tensile layer 105 is removed such that the remaining portion of tensile layer 105 has a boundary that is at a location directly over transmission line 104.

Alternatively, layer 105 may be a compressive layer. In such a case, compressive layer 105 would be removed such that the remaining portion of layer 105 has a boundary at a location between transmission line 104 and gate 104 of PFET 103. Again, this differs from the compressive layer version previously discuss with regard to FIG. 2, where again compressive layer 105 would have a boundary that is located directly over transmission line 104.

Next, referring to FIG. 7, compressive layer 301 is deposited on the entire semiconductor device to cover exposed PFET 103, exposed transmission line structure 102, and tensile layer 105. Alternatively, where layer 105 is a compressive layer, then layer 301 would be a tensile layer and would be deposited to cover exposed NFET 103, exposed transmission line structure 102, and layer 105. This step is therefore the same as the step described in connection with FIG. 3.

Next, referring to FIG. 8, a portion of compressive layer 301 is etched away to reduce the thickness of compressive layer 301. However, in contrast with the embodiment shown in FIG. 4, at least some of compressive layer 301 remains over the entire semiconductor device in this example. The thickness of compressive layer 301 may be reduced by any non-zero amount, such as by up to half of the original thickness of compressive layer 301 or even by a greater amount (i.e., to a remaining thickness of less than half of the original thickness). The portion of compressive layer 301 that is reduced in thickness is that portion that covers transmission line structure 102 and NFET 101, but not PFET 103.

Thus, in this example compressive layer 301 remains at the original thickness over PFET 103. Alternatively, where layer 105 is a compressive layer, then layer 301 would be a tensile layer and the portion thereof that would be reduced in thickness would be that portion of tensile layer 301 that covers transmission line structure 102 and PFET 103, but not NFET 101. Thus, the portion of tensile layer 301 covering NFET 101 would remain at its original thickness in such an example.

Next, referring to FIG. 9, insulating layer 502 is formed, and a plurality of through holes, such as through holes 501d, 501e, and 501f, are formed completely through insulating layer 502 and layers 105 and 301. Through holes 501d-f are then filled with a conductive material, such as a metal (e.g., tungsten), to form an electrical contact with the underlying layer exposed by each through hole 501d-f.

It is noted at this point that, due to the configuration of layers 105 and 301 in FIG. 9, the boundary between tensile and compressive layers is different as compared with that of FIGS. 4 and 5. In particular, in FIGS. 4 and 5, the boundary is located directly over transmission line 401b. Since the boundary was formed by an overlapping of layers 105 and 301, the total thickness of layers 105 and 301 through which a through hole must penetrate is approximately twice that of through holes in regions where only layer 105 or layer 301 exists. Thus, a relatively small number of through holes located at the boundary between the tensile and compressive stress regions require over-etching of a relatively larger number of through holes located away from the boundary.

In contrast, in FIG. 9, the boundary between tensile and compressive regions lies at a location between NFET 101 and transmission line structure 102. Where layer 105 is a compressive layer and layer 301 is a tensile layer, then the boundary would lie at a location between transmission line structure 102 and PFET 103. Where layer 105 is a tensile layer and layer 301 is a compressive layer, then the boundary would lie at a location between transmission line structure 102 and NFET 101. In either case, in this example there is no longer a double-thickness overlapping boundary directly over transmission line 104b.

In addition, because the thickness of layer 301 is reduced over NFET 101 (or over PFET 103 where layer 301 is a tensile layer), the total thickness of the overlapping of layers 105 and 301 is also reduced. Thus, the total thickness of layers 105 and 301 over NFET 101 may be only slightly greater than the thickness over transmission line 104b. In any event, the total overlapping thickness will be less than the sum of the original thicknesses of layers 105 and 301. This means that through hole etching may now be calibrated to etch only up to the total reduced overlapping thickness of layers 105 and 301. Thus, over-etching during through hole formation should be less than in FIGS. 4 and 5 and should occur only near the tensile/compressive boundary, such as at transmission line 104b. Moreover, instead of over-etching occurring at sensitive areas such as at source/drain regions of NFET 101 or PFET 103, any over-etching may instead occur at less sensitive areas such as at transmission line 102.

Still another example is described with regard to FIGS. 10-12. Referring to FIG. 10, tensile layer 105 and compressive layer 301 are formed and patterned as shown using an etching mask. In this case, tensile layer 105 extends so as to have a boundary disposed at a location between NFET 101 and transmission line structure 104b, and compressive layer 301 extends so as to have a boundary disposed at a location between transmission line structure 104b and PFET 103. Therefore, in this example there is at the moment an "underlap" between tensile layer 105 and compressive layer 301.

Next, referring to FIG. 11, a neutral stress layer 1101, such as an SiN layer, is blanketed over the entire semiconductor device. In contrast to layers 105 and 301, neutral stress layer 1101 provides little or no stress (neither tensile nor compressive). The thickness of neutral stress layer 1101 may be smaller than the thickness of stress-inducing layer 105 and 301.

Next, referring to FIG. 12, insulating layer 502 is formed, and through holes 501g, 501h, and 501i are formed through insulating layer 502, neutral stress layer 1101, and either tensile layer 105 or compressive layer 301. Because through holes 501g and 501i must traverse through a greater amount of SiN thickness than through hole 501h, there is a slight over-etching of through hole 501h to account for the amount of etching needed to completely etch through holes 501g and 501i. However, as discussed with regard to previous illustrative embodiments, in this case the over-etching occurs not at sensitive areas such as at source/drain regions of NFET 101 or PFET 103, but rather at less sensitive areas such as at transmission line 102.

Thus, various illustrative embodiments have been described in which the locations and/or amounts of over-etching are selectively controlled to reduce the potential for device malfunction.

What is claimed is:

1. A method for manufacturing a semiconductor device, comprising:
   forming a conductive layer on a substrate;
   removing at least one portion of the conductive layer to form a plurality of separate conductive lines;
   forming a first stress-inducing layer of a first stress type on the conductive lines and the substrate;

removing a portion of the first stress-inducing layer such that a remaining portion of the first stress-inducing layer is disposed on a first subset of the conductive lines but not a second subset of the conductive lines and has a boundary disposed between two of the conductive lines;

forming a second stress-inducing layer of a second stress type opposite the first stress type on the conductive lines, the substrate, and the first stress-inducing layer;

forming a mask layer that covers a first portion of the second stress-inducing layer over the second subset of conductive lines and exposes a second portion of the second stress-inducing layer over the first subset of conductive lines; and etching the second portion of the second stress-inducing layer using the mask layer as an etching mask, wherein the second portion of the second stress-inducing layer extends over a different third subset of the conductive lines, wherein the remaining portion of the first stress-inducing layer is not disposed on the third subset, and wherein the third subset includes a plurality of conductive lines each disposed between one of the conductive lines of the first subset and one of the conductive lines of the second subset, and wherein the first and second subsets of the conductive lines are field-effect transistor (FET) gates and the third subset of the conductive lines are not FET gates.

2. The method of claim 1, wherein etching the second portion of the second stress-inducing layer consists of etching to reduce a thickness of the second stress-inducing layer to a non-zero thickness.

3. The method of claim 1, wherein etching the second portion of the second stress-inducing layer includes etching to completely remove the second portion of the second stress-inducing layer.

4. The method of claim 1, wherein the first and second stress-inducing layers are each silicon nitride, the method further including forming a neutral stress silicon nitride layer on the first and second stress-inducing layers after the step of etching the second portion of the second stress-inducing layer.

5. The method of claim 1, wherein the semiconductor device includes a plurality of p-type field-effect transistors (PFETs) and a plurality of n-type field-effect transistors (NFETs) disposed in and on the substrate, wherein one of the first and second subsets of conductive lines are all gates of the PFETs and the other of the first and second subsets of conductive lines are all gates of the NFETs.

* * * * *